(12) United States Patent
Sugimoto et al.

(10) Patent No.: US 7,759,048 B2
(45) Date of Patent: Jul. 20, 2010

(54) PHOTOSENSITIVE RESIN COMPOSITION AND MICROLENS FORMED WITH USE THEREOF

(75) Inventors: Yasuaki Sugimoto, Kawasaki (JP); Yumiko Kase, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 12/167,996

(22) Filed: Jul. 3, 2008

(65) Prior Publication Data

US 2009/0017397 A1 Jan. 15, 2009

(30) Foreign Application Priority Data

Jul. 9, 2007 (JP) .............................. 2007-180001
Jul. 13, 2007 (JP) .............................. 2007-184888

(51) Int. Cl.
*C08K 5/28* (2006.01)
*C08L 33/14* (2006.01)
*G02B 1/04* (2006.01)
*G03F 7/004* (2006.01)
*G03F 7/023* (2006.01)

(52) U.S. Cl. ...................... 430/280.1; 430/321; 430/11; 522/154

(58) Field of Classification Search ........................ None
See application file for complete search history.

(56) References Cited

U.S. PATENT DOCUMENTS

| | | | |
|---|---|---|---|
| 6,410,206 B1 * | 6/2002 | Ueda et al. ................ | 430/280.1 |
| 6,524,756 B1 * | 2/2003 | Wu ................... | 430/5 |
| 6,994,951 B1 * | 2/2006 | Chen et al. .................. | 430/320 |
| 2002/0136968 A1 * | 9/2002 | Takebe .......................... | 430/7 |
| 2003/0039925 A1 * | 2/2003 | Jang et al. .................... | 430/322 |
| 2004/0009413 A1 * | 1/2004 | Lizotte .......................... | 430/5 |
| 2009/0023084 A1 * | 1/2009 | Ohnishi et al. .................. | 430/7 |
| 2009/0067076 A1 * | 3/2009 | Ohnishi et al. .............. | 359/885 |

FOREIGN PATENT DOCUMENTS

| | | | |
|---|---|---|---|
| JP | 2006-251464 | | 9/2006 |
| JP | 2006-257220 A1 * | | 9/2006 |
| JP | WO-2006/095478 A1 * | | 9/2006 |
| JP | WO-2006/100942 A1 * | | 9/2006 |
| JP | 2007-33518 A * | | 8/2007 |
| JP | 2008-40180 A * | | 2/2008 |
| JP | 2008-40181 A * | | 2/2008 |
| JP | 2008-175889 A * | | 7/2008 |
| JP | 2008-40182 A * | | 2/2009 |

OTHER PUBLICATIONS

English translation of JP, 2007-033518, A (2007) from machine translation from AIPN Japan Patent Office National Center for Industrial Property Information and Training, generated Jun. 12, 2009, 20 pages.*
Derwent-Acc-No. 2007-246807, English abstract of JP 2007033518A, Endo et al, Derwent Information LTD, from Derwent Week- 200725, 7 pages printed Jun. 12, 2009 from Derwent file of East database.*
AN 2007:144994, ACS on STN database, file CAPLUS, English abstract of JP 2007033518 A, Endo et al, entered in STN Feb. 9, 2007, 2 pages.*
English translation of JP, 2006-257220, A (2006) from machine translation from AIPN Japan Patent Office National Center for Industrial Property Information and Training, generated Jun. 12, 2009, 30 pages.*
English translation of JP, 2008-040180 , A (2008) from machine translation from AIPN Japan Patent Office National Center for Industrial Property Information and Training, generated Jun. 15, 2009, 21 pages.*
English translation of JP, 2008-040181 , A (2008) from machine translation from AIPN Japan Patent Office National Center for Industrial Property Information and Training, generated Jun. 15, 2009, 20 pages.*
English translation of JP, 2008-040182 , A (2008) from machine translation from AIPN Japan Patent Office National Center for Industrial Property Information and Training, generated Jun. 15, 2009, 21 pages.*
English translation of JP, 2008-175889 , A (2008) from machine translation from AIPN Japan Patent Office National Center for Industrial Property Information and Training, generated Jun. 15, 2009, 32 pages.*

\* cited by examiner

*Primary Examiner*—Cynthia Hamilton
(74) *Attorney, Agent, or Firm*—Morrison & Foerster LLP

(57) ABSTRACT

A photosensitive resin composition according to the present invention includes: a copolymer having a repeating unit having a thermal crosslinking group; and a photosensitive agent. As such, the photosensitive resin composition according to the present invention can form a resin with improved heat resistance. Further, a microlens-forming photosensitive resin composition according to the present invention includes: a copolymer having a repeating unit having a thermal crosslinking group; and a photosensitive agent, the copolymer having a mass-average molecular weight of 10,000 to 30,000. As such, the microlens-forming photosensitive resin composition according to the present invention can form a resin with improved heat resistance.

4 Claims, No Drawings

PHOTOSENSITIVE RESIN COMPOSITION AND MICROLENS FORMED WITH USE THEREOF

This Nonprovisional application claims priority under 35 U.S.C. §119(a) on Patent Application No. 180001/2007 filed in Japan on Jul. 9, 2007 and Patent Application No. 184888/2007 filed in Japan on Jul. 13, 2007, the entire contents of which are hereby incorporated by reference.

FIELD OF THE INVENTION

The present invention relates to a photosensitive resin composition, a microlens formed with use thereof, a microlens-forming photosensitive resin composition, a microlens, and a method for forming a microlens.

BACKGROUND OF THE INVENTION

Conventionally, cameras, video cameras, and the like employ solid-state image pickup devices. As such a solid-state image pickup device, a CCD (charge-coupled device) image sensor or a CMOS (complementary metal-oxide semiconductor) image sensor is used. Such an image sensor is provided with a fine converging lens (hereinafter referred to as "microlens") designed to improve light-gathering power.

Such a microlens is formed with use of a positive-type photosensitive resin composition. Specifically, first, a photosensitive resin layer is formed from a photosensitive resin composition. Then, the photosensitive resin layer is partially exposed. Next, by means of development, a pattern is formed by removing the exposed portion. After that, the photosensitive resin layer is fluidized by treating the pattern with heat, and then is shaped into a lens (hereinafter also referred to as "thermal flow"), with the result that a microlens is obtained.

In a process for manufacturing an image sensor, other components such as a color filter are formed as needed after the formation of a microlens. Such components as a color filter are formed by being treated with heat under temperature conditions of approximately 230° C. to 250° C. However, a micros lens formed with use of a lens-forming photosensitive resin composition composed mainly of a hydroxystyrene resin has such insufficient heat resistance as, for example, to become lower in transmittance when treated with heat.

In order to solve such a problem, Japanese Unexamined Patent Application Publication No. 251464/2006 (Tokukai 2006-251464; published on Sep. 21, 2006) discloses a lens-forming photosensitive resin composition excellent in heat resistance and transparency. The lens-forming photosensitive resin composition contains a thermal crosslinker. This makes it possible to form a microlens with improved heat resistance in comparison with the lens-forming photosensitive resin composition composed mainly of a hydroxystyrene resin.

SUMMARY OF THE INVENTION

However, even the aforementioned conventional example is still not sufficient in heat resistance of a lens to be obtained. The following explains a case of insufficient heat resistance. Normally, a module such as a camera having a microlens is mounted on a substrate containing an electronic circuit. In so doing, lead-containing solder is used. However, lead is harmful to humans and the environment. Therefore, in recent years, the use of lead-free solder has been advocated. Lead-free solder, which contains metal other than lead, has a higher melting point than lead-containing solder does. For this reason, in the mounting process, the use of lead-free solder requires heat treatment at higher temperatures than the use of lead-containing solder does.

A microlens formed with use of the lens-forming photosensitive resin composition of Japanese Unexamined Patent Application Publication No. 251464/2006 becomes colored depending on the temperature of heat treatment, and may become lower in transparency as a result. For this reason, there has been a demand for development of a photosensitive resin composition capable of forming a resin having high heat resistance.

It is an object of the present invention to provide a photosensitive resin composition capable of forming a resin with improved heat resistance and a microlens-forming photosensitive resin composition. Further, it is another object of the present invention to provide a microlens with improved transparency.

In order to solve the foregoing problems, a photosensitive resin composition according to the present invention includes: a copolymer; and a photosensitive agent, the copolymer having a repeating unit represented by general formula (1) and a repeating unit represented by general formula (2):

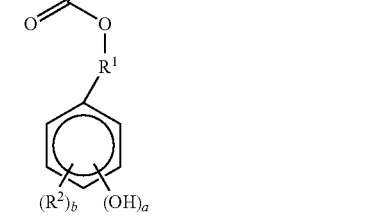

(where $R^0$s are each independently a hydrogen atom or a methyl group, $R^1$ is a single-bond or C1-C5 alkylene group, $R^2$ is a C1-C5 alkyl group, $R^3$ is a monovalent organic group having thermal crosslinking properties; a is an integer of 1 to 5, b is an integer of 0 to 4, and a+b is not more than 5, a plurality of $R^0$s repeated being allowed to differ from each other, a plurality of $R^2$s repeated being allowed to differ from each other).

In order to solve the foregoing problems, a microlens-forming photosensitive resin composition according to the present invention includes: a copolymer; and a photosensitive agent, the copolymer having a repeating unit represented by general formula (1) and a repeating unit represented by general formula (2):

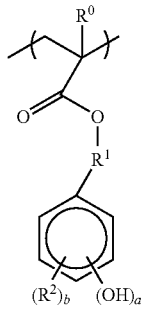

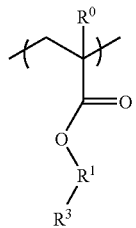

(where $R^0$s are each independently a hydrogen atom or a methyl group, $R^1$ is a single-bond or C1-C8 alkylene group, $R^2$ is a C1-C5 alkyl group, $R^3$ is a monovalent organic group having thermal crosslinking properties; a is an integer of 1 to 5, b is an integer of 0 to 4, and a+b is not more than 5, a plurality of $R^0$s repeated being allowed to differ from each other, a plurality of $R^2$s repeated being allowed to differ from each other), the copolymer having a mass-average molecular weight of 10,000 to 30,000.

Additional objects, features, and strengths of the present invention will be made clear by the description below.

DESCRIPTION OF THE EMBODIMENTS

Embodiment 1

Photosensitive Resin Composition and a Microlens Formed with Use Thereof

[Photosensitive Resin Composition]

A photosensitive resin composition of the present invention includes: a copolymer; and a photosensitive agent, the copolymer having a repeating unit (hereinafter referred to as "repeating unit (A)") represented below by general formula (1) and a repeating unit (hereinafter referred to as "repeating unit (B)") represented below by general formula (2):

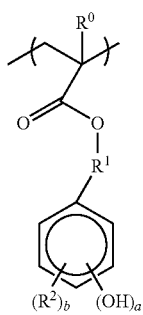
(1)

(2)

(where $R^0$s are each independently a hydrogen atom or a methyl group, $R^1$ is a single-bond or C1-C5 alkylene group, $R^2$ is a C1-C5 alkyl group, $R^3$ is a monovalent organic group having thermal crosslinking properties; a is an integer of 1 to 5, b is an integer of 0 to 4, and a+b is not more than 5, a plurality of $R^0$s repeated being allowed to differ from each other, a plurality of $R^2$s repeated being allowed to differ from each other).

The repeating unit (A) exhibits alkali solubility, and the repeating unit (B) includes a thermal crosslinking group. The photosensitive resin composition is a positive-type photosensitive resin composition.

[Copolymer]

The following first explains the repeating units (A) and (B) constituting the copolymer.

(Repeating Unit (A))

The repeating unit (A) is represented by general formula (1). In general formula (1), $R^0$ is a hydrogen atom or a methyl group, or more preferably is a hydrogen atom.

$R^1$ is a single-bond or C1-C5 alkylene group. Examples of the alkylene group include a methylene group, an ethylene group, a propylene group, an isopropylene group, a n-butylene group, an isobutylene group, a tert-butylene group, a pentylene group, an isopentylene group, and a neopentylene group. Preferred examples of the alkylene group include a methylene group and an ethylene group. Among these, $R^1$ is more preferably a methylene group.

The repeating unit (A) has a benzene ring having at least one hydroxyl group bonded thereto. The symbol "a" indicates the number of hydroxyl groups bonded to the benzene ring, and can be an integer of 1 to 5. In terms of manufacturing, it is more preferable that the symbol "a" be 1. Further, in the benzene ring, it is preferable that the bonding position of at least one of the hydroxyl groups be a fourth position, assuming that the bonding position of "—C(O)—O—$R^1$—" is a first position.

Furthermore, the benzene ring may have a C1-C5 linear or branched alkyl group bonded thereto as $R^2$. Examples of the alkyl group include a methyl group, an ethyl group, a propyl group, an isopropyl group, a n-butyl group, an isobutyl group, a tert-butyl group, a pentyl group, an isopentyl group, and a neopentyl group. Industrially, more preferred examples of the alkyl group include a methyl group and an ethyl group. The symbol "b" is an integer of 0 to 4, or more preferably is 0.

(Repeating Unit (B))

The repeating unit (B) is represented by general formula (2). In general formula (2), $R^0$ and $R^1$ are the same as those explained in the repeating unit (A). The repeating unit (B) has a thermal crosslinking group. The thermal crosslinking group is a group that sets up a crosslink when heated. Specifically, $R^3$ is a monovalent organic group having thermal crosslinking properties. Examples of the monovalent organic group include an organic group having an epoxy group or an oxetanyl group. Among them, $R^3$ is preferably an organic group having an epoxy group. This makes it possible to improve crosslinking efficiency by heat treatment.

Preferred examples of the repeating units (A) and (B) in the present invention are represented below by general formulae (1-1) and (2-1), respectively.

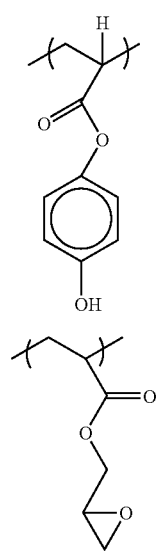

(Repeating Unit (C))

The following explains a repeating unit (hereinafter referred to as "repeating unit (C)") represented below by general formula (3). The copolymer included in the photosensitive resin composition of the present invention can have the repeating unit (C) in addition to the repeating units (A) and (B).

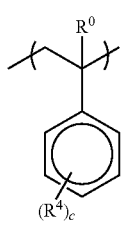

(where $R^0$s is a hydrogen atom or a methyl group, $R^4$ is a C1-C5 alkyl group; and c is an integer of 0 to 5, a plurality of $R^0$s repeated being allowed to differ from each other, a plurality of $R^4$s repeated being allowed to differ from each other.)

In general formula (3), $R^0$ is the same as that explained in the repeating unit (A). $R^4$ is the same as $R^2$ explained above. The symbol "c" is an integer of 0 to 5, or more preferably is 0. In cases where the symbol "c" is 0, it is possible to further improve the heat resistance of a lens formed from the photosensitive resin composition of the present invention.

As described above, since the copolymer has a repeating unit different from the repeating unit (A), it becomes easier to control glass-transition temperature, the rate of alkali dissolution, and heat resistance.

(Mixing Ratio of the Repeating Units)

It is preferable that the content of the repeating unit (A) in the copolymer fall within a range of 20 mol % to 80 mol %. Within this range, it becomes easier to ensure alkali solubility at the time of development. Further, it is preferable that the content of the repeating unit (B) in the copolymer fall within a range of 80 mol % to 20 mol %. When the content of the repeating unit (B) in the copolymer is at the lower limit or above, it is possible to curb the decline in transmittance due to heat treatment and it becomes easier to ensure thermosetting properties. At the upper limit or below, it is possible to inhibit residue from being left at the time of development. Further, the copolymer may be a random polymer or a block polymer.

In cases where the copolymer has the repeating unit (C), it is preferable that the content of the repeating unit (C) fall within a range of 1 mol % to 20 mol %. Within the range, it is possible to improve the heat resistance of a resulting lens.

(Molecular Weight)

It is preferable that the mass-average molecular weight (Mw: value measured in styrene volume by gel permeation chromatography (GPC)) of the copolymer fall within a range of 1,000 to 20,000, or more preferably 1,500 to 15,000. When the mass-average molecular weight of the copolymer is at the lower limit or above, it is possible to easily form a film and to better shape a pattern. At the upper limit or below, it is possible to obtain appropriate alkali solubility.

Further, it is possible to use one type of repeating unit (A) or a mixture of two or more types of repeating unit (A). Similarly, it is possible to use one type of repeating unit (B) or a mixture of two or more types of repeating unit (B), and it is possible to use one type of repeating unit (C) or a mixture of two or more types of repeating unit (C).

(Other Resin Components)

It is possible to use a mixture of the copolymer and an alkali-soluble resin including a repeating unit other than the repeating unit (A). Examples of such a resin include an acrylic resin, a hydroxystyrene resin, and a novolac resin. In this case, it is preferable that, in the whole copolymer, the content of the alkali-soluble resin including a repeating unit other than the repeating unit (A) be not more than 40 mass %, more preferably not more than 30 mass %, still more preferably not more than 20 mass %, or most preferably 0 mass %.

[Photosensitive Agent]

The photosensitive agent enhances the solubility of the copolymer with respect to an alkali solution (e.g., an aqueous solution of tetramethylammonium hydroxide) by ultraviolet radiation or the like. The photosensitive agent is preferably a photosensitive agent having a quinonediazide group (i.e., a quinonediazide-group-containing compound).

Examples of the quinonediazide-group-containing compound include a fully- or partially-esterified compound of a phenol compound with a naphthoquinonediazide sulfonic acid compound.

Examples of the phenol compound include:

a polyhydroxybenzophenone compound such as 2,3,4-trihydroxybenzophenone, 2,3,4,4'-tetrahydroxybenzophenoe;

a trisphenol compound such as tris(4-hydroxyphenyl) methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis (5-cyclohexyl-4-hydroxy-2-methylphenyl)-4-hydroxyphenyl methane, bis(5-cyclohexyl-4-hydroxy-2-methylphenyl)-3-hydroxyphenyl methane, bis(5-cyclohexyl-4-hydroxy-2-methylphenyl)-2-hydroxyphenyl methane, or bis(5-cyclohexyl-4-hydroxy-2-methylphenyl)-3,4-dihydroxy phenylmethane;

a linear trinuclear phenol compound such as 2,4-bis(3,5-dimethyl-4-hydroxybenzyl)-5-hydroxyphenol or 2,6-bis(2,5-dimethyl-4-hydroxybenzyl)-4-methylphenol;

a linear tetranuclear phenol compound such as 1,1-bis[3-(2-hydroxy-5-methylbenzyl)-4-hydroxy-5-cyclohexylphenyl]isopropane, bis[2,5-dimethyl-3-(4-hydroxy-5-methylbenzyl)-4-hydroxyphenyl]methane, bis[2,5-dimethyl-3-(4-hydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hyrdoxy-3-(2-hydroxy-5-methylbenzyl)-5-methylphenyl]methane, or bis[2,5-dimethyl-3-(2-hydroxy-5-methylbenzyl)-4-hydroxyphenyl]methane;

a linear polyphenol compound such as a linear pentanuclear phenol compound such as 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, or 2,6-bis[2,5-dimethyl-3-(2-hydroxy-5-methylbenzyl)-4-hydroxybenzyl]-4-methylphenol;

a bisphenol compound such as bis(2,3,4-trihydroxyphenyl)methane, bis(2,4-dihydroxyphenyl)methane, 2,3,4-trihydroxyphenyl-4'-hydroxyphenylmethane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, or 2-(2,3,4-trihydroxyphenyl)-2-(4'-hydroxy-3',5'-dimethylphenyl)propane;

a multinuclear branched compound such as 1-[1-(4-hyrdoxyphenyl)isopropyl]-4-[1,1-bis(4-hydroxyphenyl)ethyl]benzene or 1-[1-(3-methyl-4-hydroxyphenyl)isopropyl]-4-[1,1-bis(3-methyl-4-hydroxyphenyl)ethyl]benzene; and a condensed phenol compound such as 1,1-bis(4-hydroxyphenyl)cyclohexane.

These phenol compounds can be used alone or in combination of two or more of them.

Further, examples of the naphthoquinonediazide sulfonic acid compound include naphthoquinone-1,2-diazide-5-sulfonic acid and naphthoquinone-1,2-diazide-4-sulfonic acid.

Further, it is possible to use a product of a reaction between (i) another quinonediazide-group-containing compound, e.g., orthobenzoquinonediazide, orthonaphthoquinonediazide, orthoanthraquinonediazide, a nuclear substitution derivative thereof, such as orthonaphthoquinonediazide sulfonic ester, or orthoquinonediazide sulfonyl chloride and (ii) a compound having a hydroxyl group or an amino group, e.g., phenol, p-methoxyphenol, dimethylphnol, hydroquinone, bisphenol A, naphthol, pyrocatechol, pyrogallol, pyrogallol monomethyl ether, pyrogallol-1,3-dimethyl ether, gallic acid, gallic acid esterified or etherified with a hydroxyl group partially left, aniline, or p-aminodiphenylamine. These compounds may be used alone or in combination of two or more of them.

These quinonediazide-group-containing compounds can be prepared by condensing the polyhydroxybenzophenone and naphthoquinone-1,2-diazide-5-sulfonyl chloride or naphthoquinone-1,2-diazide-4-sulfonyl chloride in an appropriate solvent such as dioxane in the presence of alkali such as triethanolamine, alkali carbonate, or alkali hydrogen carbonate and by fully or partially esterifying the condensate.

It is preferable that the amount of the photosensitive agent to be used fall within a range of 10 mass % to 30 mass % with respect to the solid content of the photosensitive resin composition. When the amount used is not less than 10 mass %, it is possible to better form a pattern. On the other hand, when the amount used is not more than 30 mass %, it is possible to improve the developability of the photosensitive resin composition, and to inhibit residue from being left at the time of development.

(Others)

From the point of view of spreadability, the photosensitive resin composition of the present invention may be blended with a surfactant. Examples of the surfactant may be conventionally publicly-known surfactants such as a fluoride-silicone-based compound and a silicone-based compound. Specific examples are XR-104 (product name; manufactured by Dainippon Ink And Chemicals, Incorporated) and BYK-310 (product name; manufactured by BYK-Chemie Japan KK.). The amount of the surfactant to be used is not more than 400 ppm with respect to the total solid content.

Further added to the photosensitive resin composition of the present invention may be a sensitizer and a defoamer. Examples of the sensitizer include a compound having a phenolic hydroxyl group whose molecular weight is not more than 1,000. Examples of the defoamer may be publicly-known surfactants such as a silicone-based compound and a fluorinated compound.

Further, it is preferable that the photosensitive resin composition of the present application not contain a thermal crosslinker. The thermal crosslinker may reduce the transparency of a lens that has been finally formed. The photosensitive resin composition of the present application can maintain good setting properties without containing the crosslinker, and can prevent a reduction in transparency of a lens.

Particularly undesirable examples of the crosslinker include a melamine resin, a urea resin, a guanamine resin, a glycoluril-formaldehyde resin, a succinylamide-formaldehyde resin, and an ethylene urea-formaldehyde resin. Specific examples of these crosslinkers include a methoxymethylated melamine resin, a propoxymethylated melamine resin, a butoxymethylated melamine resin, a methoxymethylated urea resin, an ethoxymethylated urea resin, a propoxymethylated urea resin, and a butoxymethylated urea resin.

(Organic Solvent)

For the purpose of improving spreadability and adjusting viscosity, the photosensitive resin composition of the present invention is blended with an organic solvent.

Examples of the organic solvent include benzene, toluene, xylene, methyl ethyl ketone, acetone, methyl isobutyl ketone, cyclohexanone, methanol, ethanol, propanol, butanol, hexanol, cyclohexanol, ethylene glycol, diethylene glycol, glycerin, ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol dimethyl ether, diethylene glycol diethyl ether, 3-methoxy butyl acetate, 3-methyl-methoxybutyl acetate, propylene glycol monomethyl ether acetate (PGMEA), propylene glycol monomethyl ether propionate, propylene glycol monoethyl ether propionate, methyl carbonate, ethyl carbonate, propyl carbonate, and butyl carbonate. Among them, PGMEA is more preferable.

The amount of the organic solvent to be used is not particularly limited, but is appropriately set in accordance with the thickness of a coating film at such a concentration that the photosensitive resin composition can be spread over a substrate or the like. The organic solvent is used so that the solid concentration of the photosensitive resin composition falls within a range of 10 mass % to 50 mass %, or preferably 15 mass % to 35 mass %.

(Method for Preparing the Photosensitive Resin Composition)

The photosensitive resin composition of the present invention can be prepared, for example, by the following method.

The organic solvent, to which the copolymer, the photosensitive agent, and, as needed, other additives have been added, are mixed using a stirrer such as a three-roll mill, a ball mill, or a sand mill, and the mixture is filtrated using a 5-μm membrane filter, with the result that the photosensitive resin composition is prepared.

[Microlens]

A microlens of the present invention is formed with use of the aforementioned photosensitive resin composition. The following explains a method for forming a microlens with use of the aforementioned photosensitive resin composition.

First, a surface of a substrate such as a silicon wafer formed with an image element is planarized by providing a planarizing film on the surface. The photosensitive resin composition is spread over the substrate with use of a spinner and dried, with the result that a photosensitive resin layer having a thickness of approximately 1.0 μm to 4.0 μm is formed. Examples of the drying method include, but are not particularly limited to, any one of (i) a method for drying the photosensitive resin composition at a temperature of 80° C. to 120° C. for a duration of 60 seconds to 120 seconds with use of a hot plate, (ii) a method that leaves the photosensitive resin composition untreated at room temperature for a duration of several hours to several days, and (iii) a method for removing the solvent by leaving the photosensitive resin composition in a hot-air heater or an infrared heater for a duration of several tens of minutes to several hours. Next, the photosensitive resin layer is partially exposed by irradiating the photosensitive resin layer with activation energy radiation such as ultraviolet radiation or excimer laser light via a positive-type mask. The irradiation energy dose varies depending on the composition of the photosensitive resin composition, but preferably falls within a range of approximately 30 mJ/cm$^2$ to 2,000 mJ/cm$^2$, for example.

Next, the exposed portion is dissolved and removed by performing a developing process with use of an organic alkali aqueous solution such as an aqueous solution of tetramethylammonium hydroxide (TMAH) or an inorganic alkali aqueous solution such as sodium hydroxide, potassium hydroxide, sodium metasilicate, and sodium phosphate, with the result that a dot pattern is formed. It is preferable that the whole surface be exposed as needed after the development. By thus exposing the whole surface, the photosensitive agent that has not been exposed can be decomposed. Next, the pattern is fluidized by performing heat treatment. The heat treatment makes it possible to form a hemispherical microlens. The heat treatment only needs to be performed, for example, at a temperature of approximately 180° C. to 230° C. for a duration of approximately 2 minutes to 15 minutes.

Then, by performing a calcination process, the lens is hardened so as to maintain such a hemispherical shape. An example of the calcination process is heat treatment under conditions of 100° C. to 300° C. At this time, a crosslinking reaction proceeds in the thermal crosslinking group of the repeating unit (B). Specifically, for example, in the case of general formula (2-1), the epoxy group opens its ring, with the result that a crosslinking reaction proceeds. The crosslinking reaction causes a rise in hardness of the resin, i.e., in hardness of the microlens. This makes it possible to realize improvements in heat resistance and chemical resistance and stabilization of the shape of the lens.

The microlens according to the present invention exhibits high chemical resistance, and is stable with respect to an organic solvent and an alkali aqueous solution such as an aqueous solution of TMAH. Therefore, the present invention makes it possible to provide a microlens whose properties are hardly changed even when the lens makes contact with an organic solvent and an alkali aqueous solution in process of manufacture of an elemental device after the formation of the lens.

Further, the photosensitive resin composition of the present invention exhibits good resolving properties, and therefore can cope with a demand for microfabrication.

The microlens of the present invention can be applied, for example, as a lens of an image sensor or a liquid crystal display element. The present invention makes it possible to provide a microlens whose reduction in transparency is inhibited even in cases where various elemental devices each provided with the lens are subjected to heat treatment at high temperatures, for example, in a mounting process.

Embodiment 2

Microlens-forming Photosensitive Resin Composition, a Microlens, and a Method for Forming a Microlens

[Photosensitive Resin Composition]

A microlens-forming photosensitive resin composition of the present invention includes: a copolymer; and a photosensitive agent, the copolymer having a repeating unit (A) represented below by general formula (1) and a repeating unit (B) represented below by general formula (2):

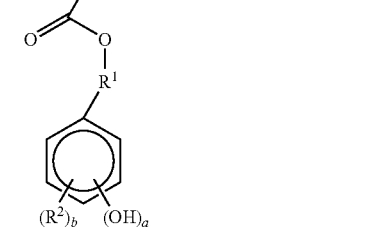

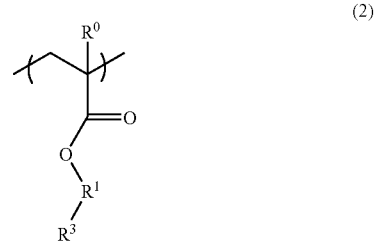

(where $R^0$s are each independently a hydrogen atom or a methyl group, $R^1$ is a single-bond or C1-C5 alkylene group, $R^2$ is a C1-C5 alkyl group, $R^3$ is a monovalent organic group having thermal crosslinking properties; a is an integer of 1 to 5, b is an integer of 0 to 4, and a+b is not more than 5, a plurality of $R^0$s repeated being allowed to differ from each other, a plurality of $R^2$s repeated being allowed to differ from each other), the copolymer having a mass-average molecular weight of 10,000 to 30,000.

The repeating unit (A) exhibits alkali solubility, and the repeating unit (B) includes a thermal crosslinking group. The photosensitive resin composition is a positive-type photosensitive resin composition.

[Copolymer]

The following first explains the repeating units (A) and (B) constituting the copolymer.

(Repeating Unit (A))

The repeating unit (A) is represented by general formula (1). In general formula (1), $R^0$ is preferably a methyl group.

$R^1$ is a single-bond or C1-C5 alkylene group. Examples of the alkylene group include a methylene group, an ethylene group, a propylene group, an isopropylene group, a n-butylene group, an isobutylene group, a tert-butylene group, a pentylene group, an isopentylene group, and a neopentylene group. Preferred examples of the alkylene group include a methylene group and an ethylene group.

The repeating unit (A) has a benzene ring having at least one hydroxyl group bonded thereto. The symbol "a" indicates the number of hydroxyl groups bonded to the benzene ring, and can be an integer of 1 to 5. In terms of manufacturing, it is more preferable that the symbol "a" be 1. Further, in the benzene ring, it is preferable that the bonding position of at least one of the hydroxyl groups be a fourth position, assuming that the bonding position of "—C(O)—O—$R^1$—" is a first position.

Furthermore, the benzene ring may have a C1-C5 linear or branched alkyl group bonded thereto as $R^2$. Examples of the alkyl group include a methyl group, an ethyl group, a propyl group, an isopropyl group, a n-butyl group, an isobutyl group, a tert-butyl group, a pentyl group, an isopentyl group, and a neopentyl group. Industrially, more preferred examples of the alkyl group include a methyl group and an ethyl group. The symbol "b" is an integer of 0 to 4, or more preferably is 0.

Preferred examples of the repeating unit (A) are represented below by general formulae (a-1) and (a-2).

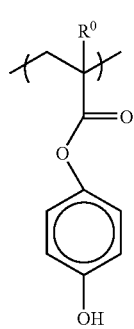

(a-1)

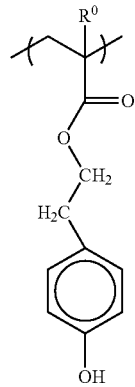

(a-2)

(where $R^0$s are each independently a hydrogen atom or a methyl group.)

Among these, the repeating unit (A) represented by general formula (a-1) is preferable, and, in particular, the case where $R^0$ is a methyl group is most preferable.

It is possible to use one type of repeating unit (A) or a mixture of two or more types of repeating unit (A).

(Repeating Unit (B))

The repeating unit (B) is represented by general formula (2). In general formula (2), $R^0$ and $R^1$ are the same as those explained in the repeating unit (A). The repeating unit (B) has a thermal crosslinking group. The thermal crosslinking group is a group that sets up a crosslink when heated. Specifically, $R^3$ is a thermal crosslinking group, and is a monovalent organic group having thermal crosslinking properties. As the monovalent organic group, $R^3$ preferably includes either an epoxy group or an oxetanyl group. Among these, $R^3$ is preferably an organic group having an epoxy group. This makes it possible to improve crosslinking efficiency by heat treatment.

As the repeating unit (B), it is possible to use the aftermentioned repeating units (B1) and (B2). In the present invention, it is possible to use the repeating unit (B1) alone or a combination of the repeating units (B1) and (B2).

(Repeating Unit (B1))

The repeating unit (B1) is a repeating unit whose $R^3$ is an organic group including a non-alicyclic structure. Preferred examples of the repeating unit (B1) are represented below by general formulae (b1-1) and (b1-2).

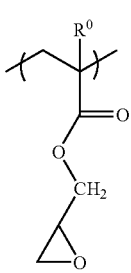

(b1-1)

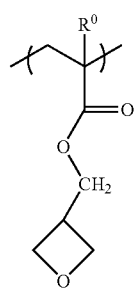
(b1-2)

(where R⁰s is a hydrogen atom or a methyl group.)

Among them, in particular, the repeating unit (B1) represented by general formula (b1-1) where $R^0$ is a methyl group is more preferable.

(Repeating Unit (B2))

The repeating unit (B2) is a repeating unit whose $R^3$ is an organic group including an alicyclic structure. Preferred examples of the repeating unit (B2) are represented below by general formulae (b2-1) to (b2-12).

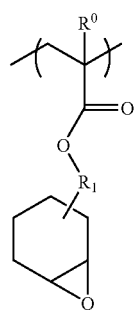
(b2-1)

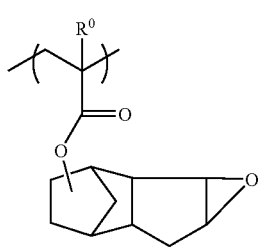
(b2-2)

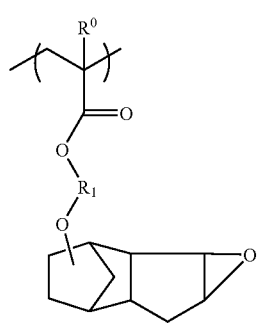
(b2-3)

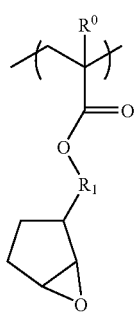
(b2-4)

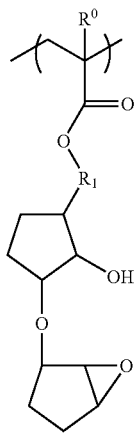
(b2-5)

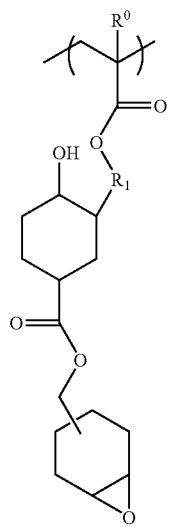
(b2-6)

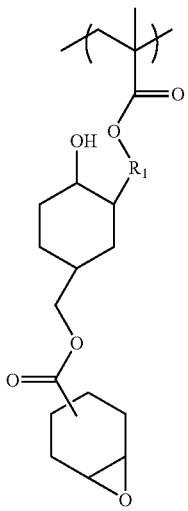
(b2-7)

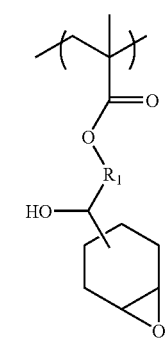
(b2-8)

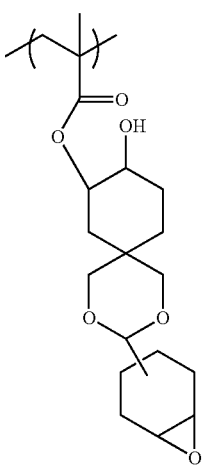
(b2-9)

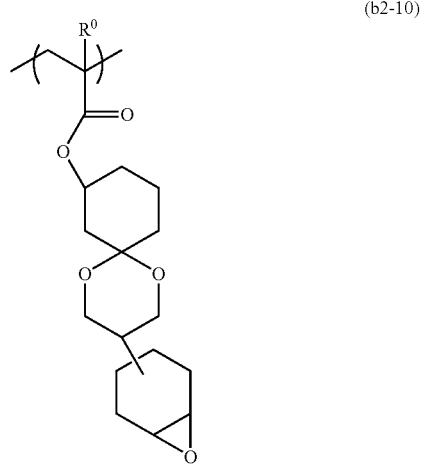
(b2-10)

(b2-11)

(b2-12)

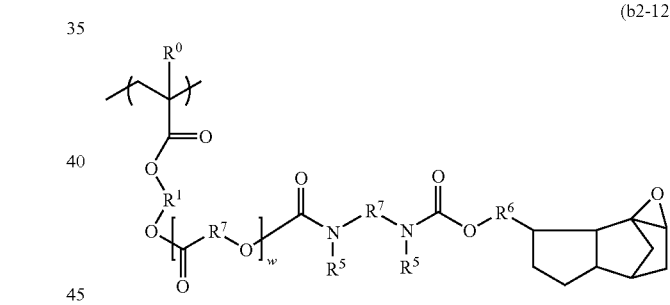

(where $R^0$s are each independently a hydrogen atom or a methyl group, $R^1$s are each independently a single-bond or C1-C5 alkylene group, $R^7$s are each independently a C1-C20 alkylene group, $R^5$s are each independently a hydrogen atom or a methyl group, $R^6$s are each independently a C1-C8 alkylene group; and w is an integer of 0 to 10.)

Among them, the repeating unit represented by general formula (b2-1) is preferable, and, in particular, the repeating unit represented by general formula (b2-1) where $R^0$ is a methyl group and $R^1$ is a methylene group is most preferable.

As described above, since the copolymer has a repeating unit different from the repeating unit (A), it becomes easier to control the rate of alkali dissolution and heat resistance.

(Molecular Weight)

The mass-average molecular weight (Mw: value measured in styrene volume by gel permeation chromatography (GPC)) of the copolymer falls within a range of 10,000 to 30,000. When the mass-average molecular weight of the copolymer is at the lower limit or above, there is an improvement in heat resistance. For example, in cases where a microlens is formed with use of the copolymer, it is possible to maintain the shape of the lens also at the time of a calcination process for hardening the microlens. Further, at the upper limit or below, it is possible to inhibit residue from being left at the time of development.

(Mixing Ratio of the Repeating Units)

The copolymer may be a random polymer or a block polymer.

It is preferable that the content of the repeating unit (A), represented by general formula (1), in the copolymer fall within a range of 20 mol % to 50 mol %. Within this range, it becomes easier to ensure alkali solubility at the time of development. Further, it is preferable that the content of the repeating unit (B), represented by general formula (2), in the copolymer fall within a range of 50 mol % to 80 mol %. When the content of the repeating unit (B) in the copolymer is at the lower limit or above, it is possible to curb the decline in transmittance due to heat treatment and it becomes easier to ensure thermosetting properties. At the upper limit or below, it is possible to inhibit residue from being left at the time of development.

It is preferable that the repeating unit (B) encompass both the repeating unit (B1) and the repeating unit (B2). In cases where the copolymer includes both the repeating unit (B1) and the repeating unit (B2), it is preferable that the content of the repeating unit (B2), represented by general formula (2), in the copolymer fall within a range of 1 mol % to 20 mol %. When the content of the repeating unit (B2) is at the lower limit or above, it is possible to improve the heat resistance of the copolymer. At the upper limit or below, it is possible to enhance crosslinking efficiency.

(Other Resin Components)

Unless the desired properties are not impaired, it is possible to use a mixture of the copolymer and an alkali-soluble resin including a repeating unit other than the repeating unit (A). Examples of such a resin include an acrylic resin, a hydroxystyrene resin, and a novolac resin. In this case, it is preferable that, in the whole copolymer, the content of the alkali-soluble resin including a repeating unit other than the repeating unit (A) be not more than 40 mass %, more preferably not more than 30 mass %, still more preferably not more than 20 mass %, or most preferably 0 mass %.

[Photosensitive Agent]

The photosensitive agent enhances the solubility of the copolymer with respect to an alkali solution (e.g., an aqueous solution of tetramethylammonium hydroxide) by ultraviolet radiation or the like. The photosensitive agent is preferably a photosensitive agent having a quinonediazide group (i.e., a quinonediazide-group-containing compound).

For details of the quinonediazide-group-containing compound, refer to the above explanation of the quinonediazide-group-containing compound in Embodiment 1.

It is preferable that the amount of the photosensitive agent to be used fall within a range of 10 mass % to 40 mass % with respect to the solid content of the photosensitive resin composition. When the amount used is not less than 10 mass %, it is possible to better form a pattern. Therefore, in cases where the photosensitive resin composition of the present invention is used for forming a microlens, it is possible to better form the shape of a lens at the time of development. On the other hand, when the amount used is not more than 40 mass %, it is possible to improve the developability of the photosensitive resin composition, and to inhibit residue from being left at the time of development.

(Others)

From the point of view of spreadability, the photosensitive resin composition of the present invention may be blended with a surfactant. For details of the surfactant, refer to the above explanation of the surfactant in Embodiment 1.

Further added to the photosensitive resin composition of the present invention may be a sensitizer and a defoamer. For details of the sensitizer and the defoamer, refer to the above explanation of the sensitizer and the defoamer in Embodiment 1.

The photosensitive resin composition of the present invention may have a crosslinker added thereto. Examples of such a crosslinker include a melamine resin, a urea resin, a guanamine resin, a glycoluril-formaldehyde resin, a succinylamide-formaldehyde resin, and an ethylene urea-formaldehyde resin. Specific examples of these crosslinkers include a methoxymethylated melamine resin, a propoxymethylated melamine resin, a butoxymethylated melamine resin, a methoxymethylated urea resin, an ethoxymethylated urea resin, a propoxymethylated urea resin, and a butoxymethylated urea resin.

However, the photosensitive resin composition of the present application can maintain good setting properties without containing such a crosslinker. Therefore, it is preferable that the photosensitive resin composition of the present application not contain a thermal crosslinker. The purpose of this is to reduce the possibility of a reduction in transparency of a lens due to a thermal crosslinker.

(Organic Solvent)

For the purpose of improving spreadability and adjusting viscosity, the microlens-forming photosensitive resin composition of the present invention is blended with an organic solvent. For details of the organic solvent, refer to the above explanation of the organic solvent in Embodiment 1.

The amount of the organic solvent to be used is not particularly limited, but is appropriately set in accordance with the thickness of a coating film at such a concentration that the photosensitive resin composition can be spread over a substrate or the like. Specifically, the organic solvent is used so that the solid concentration of the photosensitive resin composition falls within a range of 10 mass % to 50 mass %, or preferably 15 mass % to 35 mass %.

(Method for Preparing the Photosensitive Resin Composition)

The microlens-forming photosensitive resin composition of the present invention can be prepared, for example, by the following method. The copolymer is prepared with use of a publicly-known technique by mixing a monomer serving as the repeating unit (A) and a monomer serving as the repeating unit (B). The organic solvent, to which the copolymer, the photosensitive agent, and, as needed, other additives have been added, are mixed using a stirrer such as a three-roll mill, a ball mill, or a sand mill, and the mixture is filtrated using a 5-μm membrane filter, with the result that the photosensitive resin composition is prepared.

The microlens-forming photosensitive resin composition of the present invention includes a copolymer whose mass-average molecular weight falls within a range of 10,000 to 30,000. For this reason, the use of the microlens-forming photosensitive resin composition of the present invention makes it possible to manufacture a resin having a high glass-transition temperature and such heat resistance that the resin can maintain its shape even when exposed to high temperatures. Further, the microlens-forming photosensitive resin composition of the present invention includes a copolymer having a repeating unit including a thermal crosslinking group. Therefore, a resin having a crosslinking structure can be formed by performing heat treatment in forming a target resin. This makes it possible to form a resin excellent in hardness and chemical resistance.

Therefore, for example, in cases where the resin formed with use of the microlens-forming photosensitive resin composition according to the present invention is applied to a microlens, it is possible to form a microlens having heat resistance and chemical resistance.

[Microlens]

A microlens of the present invention is characterized by being formed with use of the aforementioned microlens-forming photosensitive resin composition. That is, the microlens of the present invention is formed with use of a resin excellent in heat resistance. This makes it possible to provide a microlens whose change in shape is inhibited even in cases where various elemental devices each provided with the lens are subjected to heat treatment at high temperatures, for example, in a mounting process. Therefore, the microlens of the present invention can be applied, for example, as a lens of an image sensor or a liquid crystal display element.

Furthermore, the microlens according to the present invention can be formed by the after-mentioned meltless method. This makes it possible to provide a fine microlens. The fine microlenses can be suitably used for an image sensor that has been being miniaturized in recent years.

The microlens according to the present invention exhibits high chemical resistance, and is stable with respect to an organic solvent and an alkali aqueous solution such as an aqueous solution of TMAH. Therefore, the present invention makes it possible to provide a microlens whose properties are hardly changed even when the lens makes contact with an organic solvent and an alkali aqueous solution in process of manufacture of an elemental device after the formation of the lens.

[Method for Forming a Microlens]

A method for making a microlens of the present invention is characterized by including the steps of: forming a photosensitive resin layer by spreading the aforementioned photosensitive resin composition over a substrate (photosensitive-resin-layer-forming step); forming a lens-shaped pattern by exposing the photosensitive resin layer via a halftone mask and then developing the photosensitive resin layer (pattern-forming step); and hardening the pattern by heat (thermosetting step). The following fully explains a method for forming a microlens with use of the aforementioned photosensitive resin composition. The following explains the so-called "meltless" method, which requires no thermal flow to obtain a hemispherical pattern (microlens).

(Photosensitive-resin-layer-forming Step)

First, a surface of a substrate such as a silicon wafer formed with an image element is planarized by providing a planarizing film on the surface. The photosensitive resin composition is spread over the substrate with use of a spinner and dried, with the result that a photosensitive resin layer having a thickness of approximately 1.0 µm to 4.0 µm is formed. Examples of the drying method include, but are not particularly limited to, any one of (i) a method for drying the photosensitive resin composition at a temperature of 80° C. to 120° C. for a duration of 60 seconds to 120 seconds with use of a hot plate, (ii) a method that leaves the photosensitive resin composition untreated at room temperature for a duration of several hours to several days, and (iii) a method for removing the solvent by leaving the photosensitive resin composition in a hot-air heater or an infrared heater for a duration of several tens of minutes to several hours.

(Pattern-forming Step)

Next, the photosensitive resin layer is exposed by irradiating the photosensitive resin layer with activation energy radiation such as ultraviolet radiation or excimer laser light via a multiple-tone mask such as a positive-type halftone mask or a gray-tone mask. The halftone mask realizes intermediate exposure by using a semi-transparent film, and the gray-tone mask realizes intermediate exposure by a slit's shielding part of the light. Therefore, after the exposure, the photosensitive resin layer contains a half-exposed portion in addition to the exposed portion and the unexposed portion. The solubility of the half-exposed portion varies depending on the exposure; therefore, the solubility of the half-exposed portion with respect to a developer also varies. Therefore, the use of a multiple-tone mask makes it possible to adjust the amount of photosensitive resin to be dissolved and removed by the after-mentioned developing process.

As the halftone mask, it is possible to use a mask having such a pattern whose light transmittance is 0% in the central portion of a dot, increases as the pattern extends to the periphery thereof, and is 100% in a portion corresponding to a space between microlenses. That is, the light transmittance is controlled between the central portion of the dot and the space so that the photosensitive resin layer is left with a hemispherical shape when the photosensitive resin layer has been exposed via the halftone mask and the exposed portion has been dissolved and removed by development.

The irradiation energy dose varies depending on the composition of the photosensitive resin composition, but preferably falls within a range of approximately 30 mJ/cm$^2$ to 2,000 mJ/cm$^2$, for example.

Next, the exposed portion is dissolved and removed by performing a developing process with use of an organic alkali aqueous solution such as an aqueous solution of tetramethylammonium hydroxide (TMAH) or an inorganic alkali aqueous solution such as sodium hydroxide, potassium hydroxide, sodium metasilicate, and sodium phosphate, with the result that a hemispherical lens-shaped pattern is formed. It is preferable that the whole surface be exposed as needed after the development. By thus exposing the whole surface, the photosensitive agent that has not been exposed can be decomposed.

(Thermosetting Step)

Then, the lens is hardened by performing a calcination process for hardening the lens-shaped pattern by heat. An example of the calcination process is heat treatment under conditions of 100° C. to 300° C., or more preferably under conditions of 200° C. to 220° C. At this time, a crosslinking reaction proceeds in the thermal crosslinking group of the repeating unit (B). Specifically, in cases where the repeating unit (B1) includes an epoxy group, the epoxy group opens its ring, with the result that a crosslinking reaction proceeds. The crosslinking reaction causes a rise in hardness of the resin, i.e., in hardness of the microlens. This makes it possible to realize improvements in heat resistance and chemical resistance and stabilization of the shape of the lens. Further, the photosensitive resin layer of the present invention is formed with use of a copolymer having a specific molecular weight, and therefore has such a high glass-transition temperature that the shape is not deformed due to the heat treatment before hardening.

The use of a multiple-tone mask such as a halftone mask in exposing the photosensitive resin layer makes it possible to form the hemispherical shape of the microlens at the end of development. This makes it possible to omit a conventional thermal flow step of fluidizing the photosensitive resin layer by heat treatment and shaping the dot pattern into a hemispherical lens. In recent years, microlenses have been miniaturized as image sensors have been miniaturized. Therefore, the application of the conventional thermal flow causes the pattern to expand when fluidized. This makes it necessary to increase the distance between adjacent patterns. Such an increase in distance causes an increase in a space portion (portion located between patterns and formed with no lens) where there is a loss in convergence and a decrease in amount of thermal flow. This may make it difficult to control conditions such as time and temperature of the thermal flow. On the other hand, the present embodiment omits the thermal flow step by using a multiple-tone mask, thereby preventing the pattern from expanding. This makes it possible to minimize the space portion, and to stably form a fine microlens.

The microlens-forming photosensitive resin composition according to the present embodiment is suitably used, in particular, for the meltless method for forming a lens pattern of a desired shape (esp., of a hemispherical shape) with use of a multiple-tone mask. The meltless method requires that the hemispherical shape formed after development be maintained even after the subsequent steps. At this time, if the mass-average molecular weight of the copolymer falls within a range of 10,000 to 30,000 as in the present application, the glass-transition temperature of the resin can be made so high that the shape can be prevented from being deformed before calcination.

The following explains examples of the present invention. However, the present invention is not limited to these examples.

Example 1

In 70 g of PGMA, 30 g of a copolymer, having a mass-average molecular weight of 3,000, whose molar ratio of the repeating unit (1-1) to the repeating unit (2-1) is 40:60 was dissolved. Added thereto as a photosensitive agent was 9 g of an ester compound of 1 mol of 1-[1-(4-hydroxyphenyl)isopropyl]-4-[1,1-bis(4-hydroxyphenyl)ethyl]benzene and 3 mol of 1,2-naphthoquinonediazide-5-sulfonyl chloride. Added thereto as a surfactant was 0.017 g of BYK-310 (product name; manufactured by BYK-Chemie Japan KK.). The mixture formed a photosensitive resin composition.

Example 2

A photosensitive resin composition was manufactured in the same manner as in Example 1 except that the copolymer was changed to a copolymer, having a mass-average molecular weight of 6,000, whose molar ratio of the repeating unit (1-1) to the repeating unit (2-1) is 80:20, Example 3

A photosensitive resin composition was manufactured in the same manner as in Example 1 except that the copolymer was changed to a copolymer, having a mass-average molecular weight of 10,000, whose molar ratio of the repeating unit (1-1) to the repeating unit (2-1) is 40:60.

Example 4

A photosensitive resin composition was manufactured in the same manner as in Example 1 except that the copolymer was changed to a copolymer, having a mass-average molecular weight of 3,000, whose molar ratio of the repeating unit (1-1) to the repeating unit (2-1) and the repeating unit (C) where $R^0$ is a hydrogen atom and c is 0 is 40:50:10.

Example 5

A photosensitive resin composition was manufactured in the same manner as in Example 1 except that the copolymer was changed to a copolymer, having a mass-average molecular weight of 3,000, whose molar ratio of the repeating unit (1-1) to the repeating unit (2-1) is 70:30.

Comparative Example 1

In 70 g of PGMEA, 30 g of a copolymer, having a mass-average molecular weight of 3,000, whose molar ratio of styrene to hydroxystyrene is 20:80 was dissolved. Added thereto as a photosensitive agent was 9 g of an ester compound of 1 mol of 1-[1-(4-hydroxyphenyl)isopropyl]-4-[1,1-bis(4-hydroxyphenyl)ethyl]benzene and 3 mol of 1,2-naphthoquinonediazide-5-sulfonyl chloride. Added thereto as a thermal crosslinker was 3 g of hexamethoxymethylated melamine (marketed as Mw-100LM; manufactured by Sanwa Chemical Co., Ltd.). Added thereto as a surfactant was 0.017 g of BYK-310 (product name; manufactured by BYK-Chemie Japan KK.). The mixture formed a photosensitive resin composition.

Comparative Example 2

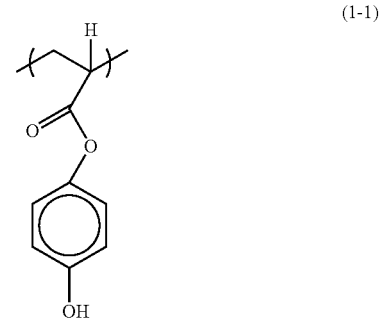

(1-1)

In 70 g of PGMEA serving as an organic solvent, 30 g of a homopolymer, having a mass-average molecular weight of 3,000, which consists of a repeating unit represented above by general formula (1-1) was dissolved. Added thereto as a photosensitive agent was 9 g of an ester compound of 1 mol of 1-[1-(4-hydroxyphenyl)isopropyl]-4-[1,1-bis(4-hydroxyphenyl)ethyl]benzene and 3 mol of 1,2-naphthoquinonediazide-5-sulfonyl chloride. Added thereto as a thermal crosslinker was 3 g of hexamethoxymethylated melamine (marketed as Mw-1100LM; manufactured by Sanwa Chemical Co., Ltd.). Added thereto as a surfactant was 0.017 g of XR-104 (product name; manufactured by Dainippon Ink And Chemicals, Incorporated). The mixture formed a photosensitive resin composition.

Comparative Example 3

In 70 g of PGMEA, 30 g of a homopolymer, having a mass-average molecular weight of 3,000, which consists of repeating units (1-1) was dissolved. Added thereto as a photosensitive agent was 9 g of an ester compound of 1 mol of 1-[1-(4-hydroxyphenyl)isopropyl]-4-[1,1-bis(4-hydroxyphenyl)ethyl]benzene and 3 mol of 1,2-naphthoquinonediazide-5-sulfonyl chloride. Added thereto as a surfactant was 0.017 g of BYK-310 (product name; manufactured by BYK-Chemie Japan KK.). The mixture formed a photosensitive resin composition.

Each of the photosensitive resin compositions thus obtained in the examples and the comparative examples was evaluated under the following conditions.

(Condition for Measurement of Resolving Properties)

Each of the photosensitive resin compositions was spread over a silicon substrate by spin coating, and then was dried at 110° C. for 90 seconds with use of a hot plate, with the result that a photosensitive resin composition layer having a film thickness of 1 μm was formed. Next, the photosensitive resin composition layer was exposed via a mask with use of a 365-nm-wavelength exposure machine, and then was subjected to a developing process with an aqueous solution of TMAH having a concentration of 2.38 mass %, with the result that a pattern was formed. At this time, the exposure with which a dot pattern with the dimensions of 3 μm×3 μm can be faithfully formed was set as an optimum exposure [Eop(mJ/cm$^2$)].

The minimum width of a space that can be resolved when spaces between dots are reduced with use of Eop (limiting resolving power) was evaluated as "resolving properties". The results are shown in Table 1.

(Condition for Measurement of the Shape of a Lens)

Each of the photosensitive resin compositions was spread over a silicon substrate by spin coating, and then was dried at 110° C. for 90 seconds with use of a hot plate, with the result that a photosensitive resin layer having a film thickness of 1 μm was formed. Next, the photosensitive resin layer was exposed via a mask with use of a 365-nm-wavelength exposure machine, and then was subjected to a developing process with an aqueous solution of TMAH having a concentration of 2.38 mass %, with the result that a dot pattern with the dimensions of 3 μm×3 μm was obtained. Furthermore, the whole surface was exposed with an exposure of 1,000 mJ by using a high-pressure mercury lamp, with the result that the photosensitive agent that had not been exposed was decomposed.

Then, the pattern was allowed to flow with heat for five minutes under temperature conditions of not more than the glass-transition temperature (e.g., 130° C. to 160° C.) with use of a hot plate, with the result that a lens was formed.

Furthermore, the lens was calcinated at 200° C. for five minutes with use of a hot plate.

The shapes of the lenses thus finished were visually observed with use of a scanning electron microscope. Those photosensitive resin compositions shaped into hemispherical lenses were evaluated as "Good", and those photosensitive resin compositions having failed to be shaped into lenses were evaluated as "Poor". These results are shown in Table 1.

(Condition for Measurement of Transmittance)

Each of the photosensitive resin compositions was spread over a 1737 glass substrate by spin coating, and then was dried at 110° C. for 90 seconds with use of a hot plate. Next, the whole surface was exposed with an exposure of 1,000 mJ by using a high-pressure mercury lamp, with the result that the photosensitive agent that had not been exposed was decomposed. A film having a film thickness of 1 μm was formed as a result of calcination at 200° C. for five minutes after heating at 160° C. for five minutes with use of a hot plate. Then, the light transmittance of the film at a wavelength of 450 nm was measured. The measurement of the light transmittance was performed by using a UV-2500PC (device name; manufactured by Shimadzu Corporation).

Next, the high-temperature resistance of the film was tested by leaving the film in an oven at 250° C. for 60 minutes. Then, the light transmittance of the film at a wavelength of 450 nm was similarly measured. These results are shown in Table 1.

(Condition for Measurement of Chemical Resistance)

Each of the photosensitive resin compositions was spread over a silicon substrate by spin coating, and then was dried at 110° C. for 90 seconds with use of a hot plate, with the result that a photosensitive resin composition layer having a film thickness of 1 μm was formed. Furthermore, after the photosensitive resin composition layer had been heated at 160° C. for five minutes with use of a hot plate, the photosensitive resin composition layer was calcinated at 200° C. for five minutes with use of a hot plate.

The film thus calcinated at 200° C. for five minutes was tested by being immersed at 23° C. for one minutes in acetone, isopropyl alcohol, propylene glycol monomethyl ether, ethyl lactate, butyl acetate, methyl isobutyl ketone, or an aqueous solution of TMAH having a concentration of 2.38 mass %.

Changes in thickness of the film during the immersion were measured. Those having shown an increase or decrease of not less than 5% in film thickness during the immersion in any one of the solvents were evaluated as "Poor", and those having shown an increase or decrease of less than 5% in film thickness during the immersion in all of the solvents were evaluated as "Good". These results are shown in Table 1.

TABLE 1

| | Example 1 | Example 2 | Example 3 | Example 4 | Example 5 | Comparative Example 1 | Comparative Example 2 | Comparative Example 3 |
|---|---|---|---|---|---|---|---|---|
| Resolving properties | 0.3 μm | 0.3 μm | 0.3 μm | 0.3 μm | 0.3 μm | 0.5 μm | 0.3 μm | 0.3 μm |
| Shapes of lenses | Good | Good | Good | Good | Good | Good | Good | Poor |
| Transmittance (200° C.) | 98% | 98% | 98% | 98% | 98% | 97% | 98% | NA |
| Transmittance (250° C.) | 97% | 97% | 97% | 97% | 92% | 68% | 90% | NA |
| Chemical resistance | Good | Good | Good | Good | Good | Good | Good | NA |

As shown in Table 1, each of the examples according to the present invention was found to exhibit high heat resistance, and to show only a small reduction in transmittance even after being heated at a high temperature of 250° C. Further, the resolving properties, the shape of the lens, and the chemical resistance were also good.

On the other hand, each of Comparative Examples 1 and 2 showed a large reduction in transmittance in particular after being heated at a high temperature. Further, Comparative Example 1 was inferior in resolving properties to the examples. Furthermore, Comparative Examples 3 was not able to be shaped into a lens. For that reason, the transmittance and the like were not measured.

As for the film obtained from the photosensitive resin composition of each of the examples, the transmittance in a visible-light region of not less than 450 nm was not less than 97%.

A photosensitive resin composition according to the present invention includes a copolymer having a repeating unit represented by general formula (2), i.e., a repeating unit including a thermal crosslinking organic group. Therefore, the photosensitive resin composition according to the present invention makes it possible to manufacture a lens having excellent heat resistance. In particular, even if the lens thus formed is exposed later to high temperatures, a reduction in transparency of the lens can be inhibited.

The following explains further examples of the present invention. However, the present invention is not limited to these examples. Each of the following examples uses, as the repeating units (A), (B1), and (B2), repeating units represented by general formulae (4), (5), and (6), respectively.

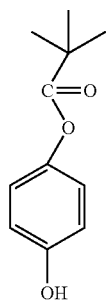

(4)

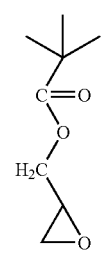

(5)

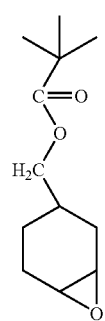

(6)

Example 6

In 70 g of PGMA, 30 g of a copolymer, having a mass-average molecular weight of 10,000, whose molar ratio of the repeating unit (A) to the repeating unit (B1) is 40:60 was dissolved. Added thereto as a photosensitive agent was 9 g of an ester compound of 1 mol of 1-[1-(4-hydroxyphenyl)isopropyl]-4-[1,1-bis(4-hydroxyphenyl)ethyl]benzene and 3 mol of 1,2-naphthoquinonediazide-5-sulfonyl chloride. Added thereto as a surfactant was 0.017 g of BYK-310 (product name; manufactured by BYK-Chemie Japan KK.). The mixture formed a photosensitive resin composition.

Example 7

A photosensitive resin composition was manufactured in the same manner as in Example 6 except that the copolymer was changed to a copolymer, having a mass-average molecular weight of 10,000, whose molar ratio of the repeating unit (A) to the repeating unit (B1) is 80:20.

Example 8

A photosensitive resin composition was manufactured in the same manner as in Example 6 except that the copolymer was changed to a copolymer, having a mass-average molecular weight of 30,000, whose molar ratio of the repeating unit (A) to the repeating unit (B1) is 40:60.

Example 9

A photosensitive resin composition was manufactured in the same manner as in Example 8 except that the amount of the photosensitive agent to be added was changed from 9 g to 3 g.

Example 10

A photosensitive resin composition was manufactured in the same manner as in Example 8 except that the amount of the photosensitive agent to be added was changed from 9 g to 12 g.

Example 11

A photosensitive resin composition was manufactured in the same manner as in Example 6 except that the copolymer was changed to a copolymer, having a mass-average molecular weight of 10,000, whose molar ratio of the repeating unit (A) to the repeating unit (B1) and the repeating unit (B2) is 40:55:5.

Example 12

A photosensitive resin composition was manufactured in the same manner as in Example 6 except that the copolymer was changed to a copolymer, having a mass-average molecular weight of 20,000, whose molar ratio of the repeating unit (A) to the repeating unit (B1) and the repeating unit (B2) is 40:50:10.

Comparative Example 4

A photosensitive resin composition was manufactured in the same manner as in Example 6 except that the copolymer was changed to a copolymer, having a mass-average molecular weight of 9,000, whose molar ratio of the repeating unit (A) to the repeating unit (B1) is 40:60.

Comparative Example 5

A photosensitive resin composition was manufactured in the same manner as in Example 6 except that the copolymer was changed to a copolymer, having a mass-average molecular weight of 35,000, whose molar ratio of the repeating unit (A) to the repeating unit (B1) is 40:60.

Comparative Example 6

A photosensitive resin composition was manufactured in the same manner as in Example 6 except that the amount of the photosensitive agent to be added was changed from 9 g to 2.7 g.

Comparative Example 7

A photosensitive resin composition was manufactured in the same manner as in Example 6 except that the copolymer was changed to a copolymer, having a mass-average molecular weight of 9,000, whose molar ratio of the repeating unit (A) to the repeating unit (B1) and the repeating unit (B2) is 40:50:10.

Each of the photosensitive resin compositions thus obtained in the examples and the comparative examples was evaluated under the following conditions.

(Condition for Measurement of the Shape of a Lens)

Each of the photosensitive resin compositions was spread over a silicon substrate by spin coating, and then was dried at 110° C. for 90 seconds with use of a hot plate, with the result that a photosensitive resin layer having a film thickness of 1 μm was formed. Next, the photosensitive resin layer was exposed with use of a 365-nm-wavelength exposure machine via a halftone mask whose light transmittance is adjusted to be 0% in the central portion of each lens and to increase as the mask extends to the periphery thereof. Then, the photosensitive resin layer was subjected to a developing process with an aqueous solution of TMAH having a concentration of 2.38 mass %, with the result that a hemispherical microlens was formed. Furthermore, the whole surface was exposed with an exposure of 1,000 mJ by using a high-pressure mercury lamp, with the result that the photosensitive agent that had not been exposed was decomposed. After that, the remaining solvent was removed from the microlens by heating the microlens at 110° C. to 130° C. for five minutes with use of a hot plate. Furthermore, the microlens was calcinated at 220° C. for five minutes with use of a hot plate.

The shapes of the lenses thus developed but yet to be calcinated and the lenses thus calcinated were visually observed with use of a scanning electron microscope. Those photosensitive resin compositions shaped into hemispherical lenses were evaluated as "Good", and those photosensitive resin compositions having failed to be shaped into lenses were evaluated as "Poor". These results are shown in Table 2. It should be noted that those photosensitive resin compositions having failed to be shaped into hemispherical lenses before calcination were omitted from the observation of the shapes of the lenses thus calcinated.

(Condition for Measurement of Light Transmittance)

Each of the photosensitive resin compositions was spread over a 1737 glass substrate by spin coating, and then was dried at 110° C. for 90 seconds with use of a hot plate. Next, the whole surface was exposed with an exposure of 1,000 mJ by using a high-pressure mercury lamp, with the result that the photosensitive agent that had not been exposed was decomposed. A film having a film thickness of 1 μm was formed as a result of calcination at 220° C. for five minutes after heating at 160° C. for five minutes with use of a hot plate. Then, the light transmittance of the film at a wavelength of 450 nm was measured. The measurement of the light transmittance was performed by using a UV-2500PC (device name; manufactured by Shimadzu Corporation). These results are shown in Table 2. It should be noted that those photosensitive resin compositions having failed to be shaped into hemispherical lenses before or after calcination were omitted from the measurement of transmittance.

(Condition for Measurement of Chemical Resistance)

Each of the photosensitive resin compositions was spread over a silicon substrate by spin coating, and then was dried at 110° C. for 90 seconds with use of a hot plate, with the result that a photosensitive resin composition layer having a film thickness of 1 μm was formed. Furthermore, the remaining solvent was removed from photosensitive resin composition layer by heating the photosensitive resin composition layer at 110° C. to 130° C. for five minutes with use of a hot plate.

Furthermore, the photosensitive resin composition layer was calcinated at 220° C. for five minutes with use of a hot plate.

The film thus calcinated at 220° C. for five minutes was tested by being immersed at 23° C. for five minutes in acetone, isopropyl alcohol, propylene glycol monomethyl ether, ethyl lactate, butyl acetate, methyl isobutyl ketone, or an aqueous solution of TMAH having a concentration of 2.38 mass %.

Changes in thickness of the film during the immersion were measured. Those having shown an increase or decrease of not less than 5% in film thickness during the immersion in any one of the solvents were evaluated as "Poor", and those having shown an increase or decrease of less than 5% in film thickness during the immersion in all of the solvents were evaluated as "Good". These results are shown in Table 2. It should be noted that those photosensitive resin compositions having failed to be shaped into hemispherical lenses before or after calcination were omitted from the measurement of chemical resistance.

TABLE 2

|  | Shapes of lenses after development | Shapes of lenses after calcination | Light transmittance | Chemical resistance |
| --- | --- | --- | --- | --- |
| Example 6 | Good | Good | 98% | Good |
| Example 7 | Good | Good | 98% | Good |
| Example 8 | Good | Good | 98% | Good |
| Example 9 | Good | Good | 98% | Good |
| Example 10 | Good | Good | 98% | Good |
| Example 11 | Good | Good | 98% | Good |
| Example 12 | Good | Good | 98% | Good |
| Comparative Example 4 | Good | Poor | NA | NA |
| Comparative Example 5 | Poor | NA | NA | NA |
| Comparative Example 6 | Poor | NA | NA | NA |
| Comparative Example 7 | Good | Poor | NA | NA |

As shown in Table 2, each of the examples according to the present invention was found to exhibit high heat resistance, and to show no deformation in lens shape even after being heated at a high temperature of 220° C. Further, the light transmittance and the chemical resistance were also good. On the other hand, in each of Comparative Examples 4 to 7, the microlens was not able to maintain its semispherical shape after development or after being heated at a high temperature of 220° C.

A microlens-forming photosensitive resin composition according to the present invention includes a copolymer, having a specific repeating unit, whose mass-average molecular weight falls within a range of 10,000 to 30,000. For this reason, the microlens-forming photosensitive resin composition of the present invention makes it possible to manufacture a resin having a high glass-transition temperature and such heat resistance and shape stability as to be able to maintain its shape even when exposed to high temperatures. Further, the microlens-forming photosensitive resin composition according to the present invention includes a copolymer having a repeating unit including a thermal crosslinking organic group. For this reason, the resin can be hardened by forming a crosslink with heat. This makes it possible to manufacture a resin with improved heat resistance and chemical resistance.

As described above, a photosensitive resin composition according to the present invention can be suitably used for a microlens that is to be so provided in an image sensor such as a CCD or a CMOS as to improve light-gathering power.

Further, a microlens-forming photosensitive resin composition of the present invention can be suitably used for a microlens that is to be so provided in an image sensor such as a CCD or a CMOS as to improve light-gathering power.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A microlens-forming photosensitive resin composition comprising:
   a copolymer; and
   a photosensitive agent, the copolymer having a repeating unit (A) represented by general formula (1) and a repeating unit (B) represented by general formula (2):

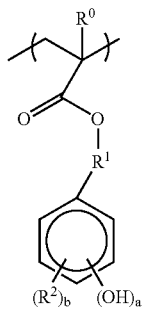

(1)

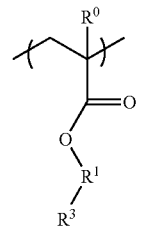

(2)

(where $R^0$s are each independently a hydrogen atom or a methyl group, $R^1$ is a single-bond or C1-C5 alkylene group, $R^2$ is a C1-C5 alkyl group, $R^3$ is a monovalent organic group having thermal crosslinking properties; a is an integer of 1 to 5, b is an integer of 0 to 4, and a+b is not more than 5, a plurality of $R^0$s repeated being allowed to differ from each other, a plurality of $R^2$s repeated being allowed to differ from each other), the copolymer having a mass-average molecular weight of 10,000 to 30,000, the repeating unit represented by general formula (1) being contained in the copolymer in 20 mol% to 50 mol%, and the repeating unit represented by general formula (2) being contained in the copolymer in 50 mol% to 80 mol%, wherein the copolymer repeating unit (B) includes a repeating unit (B1) whose $R^3$ is an organic group including a non-alicyclic structure, and a repeating unit (B2) whose $R^3$ is an organic group including an alicyclic structure, wherein the repeating unit (B2) is contained in the copolymer in 1 mol% to 20 mol%.

2. The microlens-forming photosensitive resin composition as set forth in claim 1, wherein $R^3$ includes either an epoxy group or an oxetanyl group.

3. A microlens formed with use of a microlens-forming photosensitive resin composition comprising: a copolymer; and a photosensitive agent, the copolymer having a repeating unit (A) represented by general formula (1) and a repeating unit (B) represented by general formula (2):

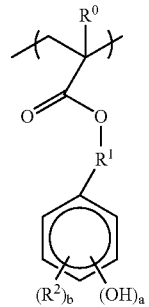

(1)

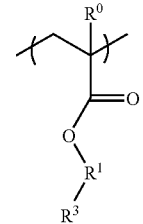

(2)

(where $R^0$s are each independently a hydrogen atom or a methyl group, $R^1$ is a single-bond or C1-C5 alkylene group, $R^2$ is a C1-C5 alkyl group, $R^3$ is a monovalent organic group having thermal crosslinking properties; a is an integer of 1 to 5, b is an integer of 0 to 4, and a+b is not more than 5, a plurality of $R^0$s repeated being allowed to differ from each other, a plurality of $R^2$s repeated being allowed to differ from each other), the copolymer having a mass-average molecular weight of 10,000 to 30,000, the repeating unit represented by general formula (1) being contained in the copolymer in 20 mol% to 50 mol%, and the repeating unit represented by general formula (2) being contained in the copolymer in 50 mol% to 80 mol%, wherein the copolymer repeating unit (B) includes a repeating unit (B1) whose $R^3$ is an organic group, including a non-alicyclic structure, and a repeating unit (B2) whose $R^3$ is an organic group including an alicyclic structure, wherein the repeating unit (B2) is contained in the copolymer in 1 mol% to 20 mol%.

4. A method for forming a microlens, comprising the steps of:
   forming a photosensitive resin layer by spreading, over a substrate, a microlens-forming photosensitive resin composition including (i) a copolymer and (ii) a photosensitive agent, the copolymer having a repeating unit (A) represented by general formula (1) and a repeating unit (B)

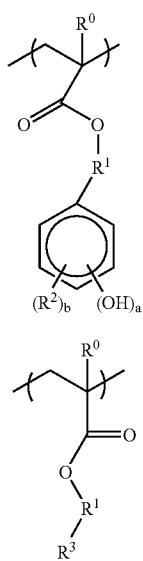

(where $R^0$s are each independently a hydrogen atom or a methyl group, $R^1$ is a single-bond or C1-C5 alkylene group, $R^2$ is a C1-C5 alkyl group, $R^3$ is a monovalent organic group having thermal crosslinking properties; a is an integer of 1 to 5, b is an integer of 0 to 4, and a+b is not more than 5, a plurality of $R^0$s repeated being allowed to differ from each other, a plurality of $R^2$s repeated being allowed to differ from each other), the copolymer having a mass-average molecular weight of 10,000 to 30,000, the repeating unit represented by general formula (1) being contained in the copolymer in 20 mol% to 50 mol%, and the repeating unit represented by general formula (2) being contained in the copolymer in 50 mol% to 80 mol%;

forming a lens-shaped pattern by exposing the photosensitive resin layer via a halftone mask and then developing the photosensitive resin layer; and hardening the pattern by heat, wherein the copolymer repeating unit (B) includes a repeating unit (B1) whose $R^3$ is an organic group including a non-alicyclic structure, and a repeating unit (B2) whose $R^3$ is an organic group including an alicyclic structure, wherein the repeating unit (B2) is contained in the copolymer in 1 mol% to 20 mol%.

* * * * *